United States Patent
Chan et al.

(10) Patent No.: US 7,508,888 B2
(45) Date of Patent: Mar. 24, 2009

(54) METHOD AND APPARATUS FOR PRECISE OPEN LOOP TUNING OF REFERENCE FREQUENCY WITHIN A WIRELESS DEVICE

(75) Inventors: Wen-Yen Chan, Thornhill (CA); Xin Jin, Ottawa (CA); Qingzhong Jiao, Nepean (CA); Nasserullah Khan, Waterloo (CA); Nagula Tharma Sangary, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 508 days.

(21) Appl. No.: 11/116,233

(22) Filed: Apr. 28, 2005

(65) Prior Publication Data

US 2006/0104394 A1      May 18, 2006

Related U.S. Application Data

(60) Provisional application No. 60/628,552, filed on Nov. 18, 2004.

(51) Int. Cl.
 *H03D 3/18* (2006.01)
 *H03D 3/24* (2006.01)
(52) U.S. Cl. ............... 375/327; 375/344; 375/325; 375/326; 375/376; 455/258
(58) Field of Classification Search ............... 375/344, 375/325, 326, 327, 219, 222, 376; 455/258
 See application file for complete search history.

(56) References Cited

U.S. PATENT DOCUMENTS

| | | | |
|---|---|---|---|
| 4,703,520 A | 10/1987 | Rozanski, Jr. et al. | |
| 6,223,061 B1 | 4/2001 | Dacus et al. | |
| 6,307,439 B2 | 10/2001 | Cunning | |
| 6,747,521 B1 | 6/2004 | Allott | |
| 2003/0171105 A1 | 9/2003 | Dunworth et al. | |
| 2003/0181183 A1* | 9/2003 | Ventura | 455/258 |

FOREIGN PATENT DOCUMENTS

| | | |
|---|---|---|
| EP | 0 664 616 A2 | 7/1995 |
| JP | 04-369927 | 12/1992 |
| WO | WO 02/052776 A1 | 7/2002 |

OTHER PUBLICATIONS

International Search Report for PCT/CA2005/000643 dated Aug. 17, 2005.

(Continued)

*Primary Examiner*—Phuong Phu
(74) *Attorney, Agent, or Firm*—Bereskin & Parr

(57) ABSTRACT

A communications subsystem for a wireless device for correcting errors in a reference frequency signal. The communications subsystem comprises a frequency generator for generating the reference frequency signal and a closed loop reference frequency correction module that generates a reference frequency adjustment signal for correcting the reference frequency signal when the communications subsystem operates in closed loop mode. The subsystem further includes an open loop frequency correction means that samples values of the reference frequency adjustment signal during the closed loop mode and generates a frequency correction signal for correcting the reference frequency signal when the communications subsystem operates in a mode other than closed loop mode.

23 Claims, 4 Drawing Sheets

OTHER PUBLICATIONS

Written Opinion for corresponding international application PCT/CA2005/000643, date of mailing Aug. 17, 2005.

Supplemental European search report for EP patent application No. 05739067.6, dated May 21, 2007.

Exam report for EP patent application No. 05739067.6, dated Aug. 3, 2007.

International Preliminary Report on Patentability for international application No. PCT/CA2005/000643, date of mailing May 31, 2007.

European Search and Examination Report for a related European Patent Application No. EP 05739067.6 dated Feb. 13, 2008.

European Examination Report for a related European Patent Application No. EP 05739067.6 dated Oct. 29, 2008.

Canadian Office Action for a related Canadian Patent Application No. 2,554,123 dated Dec. 29, 2008.

* cited by examiner

METHOD AND APPARATUS FOR PRECISE OPEN LOOP TUNING OF REFERENCE FREQUENCY WITHIN A WIRELESS DEVICE

REFERENCE TO RELATED APPLICATION

This application claims priority from U.S. Provisional Patent Application Ser. No. 60/628,552 filed on Nov. 18, 2004.

FIELD OF THE TECHNOLOGY

Various embodiments described herein relate generally to wireless communications devices and associated networks, and more particularly to wireless communications devices communicating data within wireless communications networks such as Code Division Multiple Access (CDMA) networks for example. In particular, the embodiments described herein relate to a system and method for tuning a reference frequency.

BACKGROUND

In a wireless device such as a mobile phone, an oscillator is required for generating a reference frequency that may be used by a wireless transceiver for transmitting and receiving wireless signals. Various types of oscillators may be used such that the reference frequency is generated with sufficient accuracy. Accordingly, oscillators have been made which compensate for sources of error in the generated reference frequency. One example of such an oscillator is a temperature compensated voltage controlled crystal oscillator (TCVCXO). However, the free running frequency of a TCVCXO may not be accurate enough in certain situations. Accordingly, a closed loop frequency compensation technique is typically utilized to fine-tune the generated frequency when the handset has acquired the signals from the wireless network, with the assumption that, the frequency of the incoming signals from a wireless network is accurate.

Closed-loop frequency compensation methods rely on some sort of phase locked loop (PLL) or automatic frequency control loop to adjust the local frequency source according to an external accurate frequency source. Wireless networks such as CDMA2000 networks have a very accurate reference frequency which is locked to a GPS system, and in turn is locked to the atomic frequency standard. Other wireless networks such GSM/GPRS, TDMA, etc also have a fairly accurate reference frequency although not to the degree of a CDMA2000 network. However, it is costly to use a closed loop frequency compensation method at all times for a variety of reasons. For instance, it takes time to accurately lock to a high frequency source. Also, before a frequency lock is obtained, the local frequency generator of the wireless device is still inaccurate. In addition, when the wireless device is working with another signal source, the local frequency generator may not be suitable for use with a closed loop compensation scheme to achieve a desired reference frequency accuracy since the other signal source may not have superior frequency accuracy (e.g. 802.11 WLAN). Accordingly, the wireless communications device can lock to the other signal source, but cannot achieve the required absolute frequency accuracy after tuning back from the other signal source. In another example, the other signal source may have a very accurate reference frequency, (e.g. it may obtain the reference frequency via GPS), but if the wireless communications device only tracks the other signal source for a very short period of time, such as 2 seconds for example, frequency tracking to the other signal source is difficult to establish. In both cases, there is also a power cost associated with relying on the external reference frequency since monitoring the other signal source requires additional power consumption by the wireless communications device.

Further, it has been found that the closed loop frequency compensation technique cannot help in the following cases:

1. During the initial acquisition of the wireless signal from the wireless network after the transceiver of the wireless device has been turned on after being off for an extended period of time;
2. During the initial re-acquisition of the wireless signal from the wireless network after the transceiver has "woken up" from a sleep state;
3. While the transceiver has tuned away from the wireless network to receive signals from other sources, and in this state the closed loop compensation technique is not functional; and,
4. At the initial period to reacquire the signal from the wireless network after the transceiver tunes back from the state described in case 3.

Such cases require precise and quick generation of the reference frequency without closed loop compensation. This is because closed loop frequency compensation requires time to lock into the desired reference frequency and reach a steady state value for the reference frequency.

BRIEF DESCRIPTION OF THE FIGURES

For a better understanding of the exemplary embodiments described herein, and to show more clearly how they may be carried into effect, reference will now be made, by way of example only, to the accompanying drawings in which.

DETAILED DESCRIPTION

Figure 1:
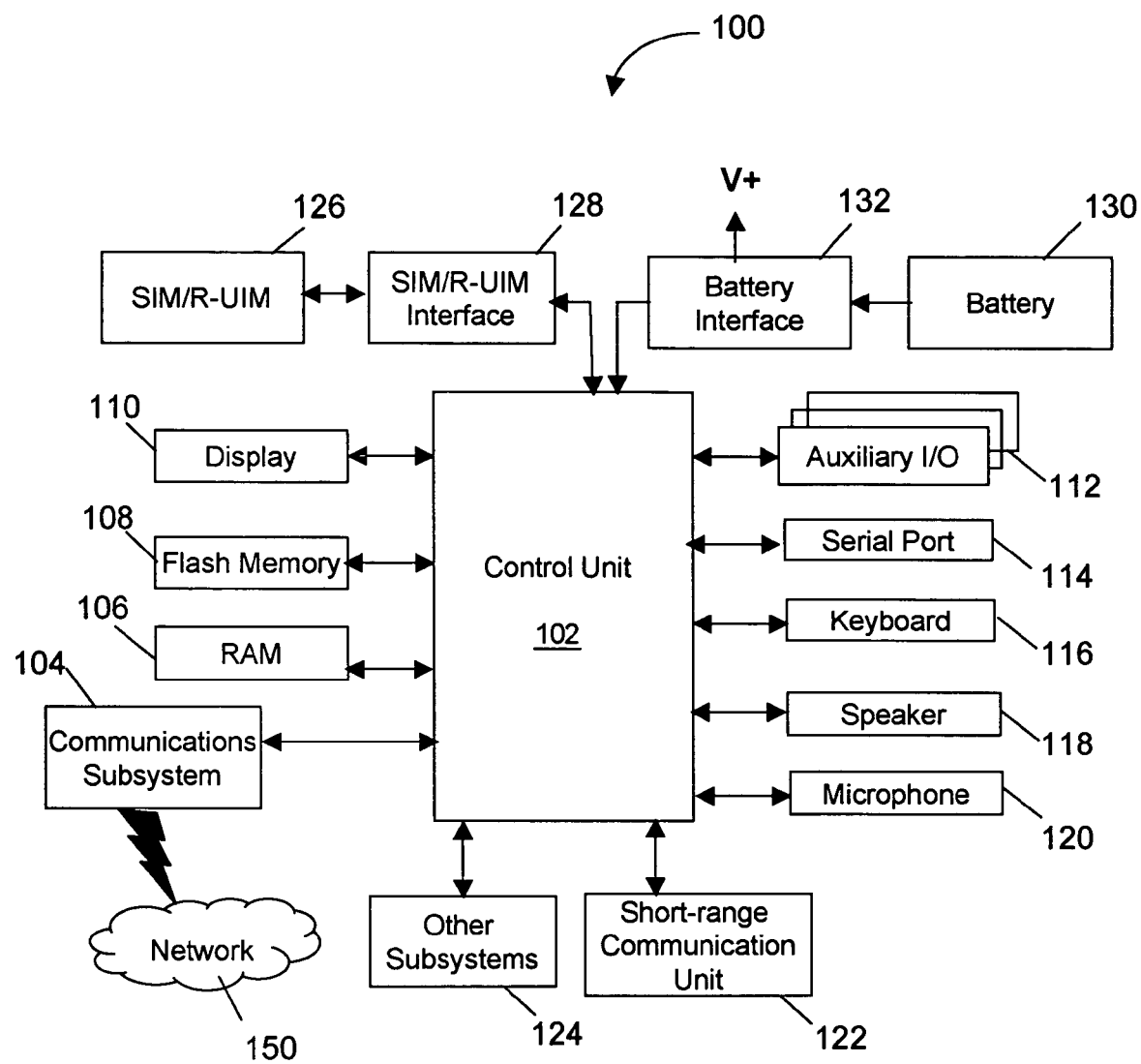
FIG. 1 is a block diagram of an exemplary embodiment of a wireless communications device.

It will be appreciated that for simplicity and clarity of illustration, where considered appropriate, reference numerals may be repeated among the figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, well-known methods, procedures and components have not been described in detail so as not to obscure the exemplary embodiments described herein. Furthermore, this description is not to be considered as limiting the scope of the embodiments described herein, but rather as merely providing exemplary working embodiments.

Exemplary embodiments of a communications subsystem are described herein which may be applied to a wireless communications device. A wireless communications device is a two-way communications device with advanced data communication capabilities having the capability to communicate with other computer systems. The wireless communications device may also include the capability for voice communications. Depending on the functionality provided by the wireless communications device, it may be referred to as a data messaging device, a two-way pager, a cellular telephone with data messaging capabilities, a wireless Internet appliance, or a data communications device (with or without telephony capabilities). The wireless communications device communicates with other devices through a network of transceiver stations.

Referring first to FIG. 1, shown therein is a block diagram of an exemplary embodiment of a wireless communications device 100 which may also be referred to as a mobile device. The wireless communications device 100 comprises a number of components, such as a control unit 102 which controls the overall operation of the wireless communications device 100. The control unit 102 may be a microprocessor or a microcontroller. Any commercially available microcontroller, such as a microcontroller available from ARM, Motorola, Intel and the like may be used for the control unit 102.

Communication functions, including data and possibly voice communications, are performed through the communications subsystem 104. The communications subsystem 104 receives messages from and sends messages to a wireless network 150. In an embodiment, the communications subsystem 104 may be configured in accordance with the cdma2000 standards, or with the Global System for Mobile Communication (GSM) and General Packet Radio Services (GPRS) standards. The GSM/GPRS wireless network is used worldwide and it is expected that these standards will eventually be superseded by the Enhanced Data GSM Environment (EDGE) and Universal Mobile Telecommunications Service (UMTS) standards. New standards are still being defined, but it is believed that they will have similarities to the network behaviour described herein, and it will also be understood that the device 100 is intended to use any other suitable standards that are developed in the future. The wireless link connecting the communications subsystem 104 with the network 150 represents one or more different Radio Frequency (RF) channels, operating according to defined protocols specified for cdma2000 or GSM/GPRS communications. With the network protocols, these channels are capable of supporting both circuit switched voice communications and packet switched data communications.

The control unit 102 also interacts with additional subsystems such as a Random Access Memory (RAM) 106, a flash memory 108, a display 110, an auxiliary input/output (I/O) subsystem 112, a serial port 114, a keyboard 116, a speaker 118, a microphone 120, a short-range communications unit 122 and other subsystems 124. Some of these components may be optional depending on the particular type of wireless communications device. Other types of non-volatile storage devices known in the art may be used rather than the flash memory 108. The keyboard 116 may be a telephone-type keypad, an alphanumeric keyboard or some other suitable keypad.

Some of the subsystems of the wireless communications device 100 perform communication-related functions, whereas other subsystems may provide "resident" or on-device functions. By way of example, the display 110 and the keyboard 116 may be used for both communication-related functions, such as entering a text message for transmission over the network 150, and device-resident functions such as a calculator or task list. Operating system software, and other various algorithms, used by the control unit 102 is typically stored in a persistent store such as the flash memory 108, which may alternatively be a read-only memory (ROM) or similar storage element (not shown). Those skilled in the art will appreciate that the operating system, specific device applications, or parts thereof, may be temporarily loaded into a volatile store such as the RAM 106.

The wireless communications device 100 may send and receive communication signals over the network 150 after required network registration or activation procedures have been completed. Network access is associated with a subscriber or user of the wireless communications device 100. To identify a subscriber, the wireless communications device 100 requires a Subscriber Identity Module or "SIM" card 126 or an R-UIM (Removable User Identity Module) 126 to be inserted in a SIM/R-UIM interface 128 in order to communicate with the network 150. The SIM card or R-UIM 126 is one type of a conventional "smart card" that is used to identify a subscriber of the wireless communications device 100 and to personalize the wireless communications device 100, among other things. Alternatively, user identification information can also be programmed into flash memory 108. Services may include: web browsing and messaging such as email, voice mail, Short Message Service (SMS), and Multimedia Messaging Services (MMS). More advanced services may include: point of sale, field service and sales force automation.

The wireless communications device 100 is a battery-powered device and includes a battery interface 132 for receiving one or more rechargeable batteries 130. The battery interface 132 is coupled to a regulator (not shown) which assists the battery 130 in providing power V+ to the wireless communications device 100. Although current technology makes use of a battery, future technologies such as micro fuel cells may provide the power to the wireless communications device 100.

The control unit 102, in addition to its operating system functions, enables execution of software applications on the wireless communications device 100. A set of applications which control basic device operations, including data and voice communication applications will normally be installed on the wireless communications device 100 during its manufacture. Another application that may be loaded onto the wireless communications device 100 would be a personal information manager (PIM). A PIM has functionality to organize and manage data items of interest to a subscriber, such as, but not limited to, e-mail, calendar events, voice mails, appointments, and task items. A PIM application has the ability to send and receive data items via the wireless network 150. In one embodiment, PIM data items are seamlessly integrated, synchronized, and updated via the wireless network 150 with the wireless communications device subscriber's corresponding data items stored and/or associated with a host computer system. This functionality creates a mirrored host computer on the wireless communications device 100 with respect to such items. This is especially advantageous where the host computer system is the wireless communications device subscriber's office computer system.

Additional applications may also be loaded onto the wireless communications device 100 through the network 150, the auxiliary I/O subsystem 112, the serial port 114, the short-range communications subsystem 122, or any other suitable subsystem 124. This flexibility in application installation increases the functionality of the wireless communications device 100 and may provide enhanced on-device functions, communication-related functions, or both. For example, secure communication applications may enable electronic commerce functions and other such financial transactions to be performed using the wireless communications device 100.

The serial port 114 enables a subscriber to set preferences through an external device or software application and extends the capabilities of the wireless communications device 100 by providing for information or software downloads to the wireless communications device 100 other than through a wireless communication network. The alternate download path may, for example, be used to load an encryption key onto the wireless communications device 100 through a direct and thus reliable and trusted connection to provide secure device communication.

The short-range communications subsystem 122 provides for communication between the wireless communications device 100 and different systems or devices, without the use of the network 150. For example, the subsystem 122 may include an infrared device and associated circuits and components for short-range communication. Examples of short-range communication may include standards developed by the Infrared Data Association (IrDA), Bluetooth, and the 802.11 family of standards developed by IEEE.

In use, a received signal such as a text message, an e-mail message, or web page download will be processed by the communications subsystem 104 and input to the control unit 102. The control unit 102 will then process the received signal for output to the display 110 or alternatively to the auxiliary I/O subsystem 112. A subscriber may also compose data items, such as e-mail messages, for example, using the keyboard 116 in conjunction with display 110 and possibly auxiliary I/O subsystem 112. The auxiliary subsystem 112 may include devices such as: a touch screen, mouse, track ball, infrared fingerprint detector, or a roller wheel with dynamic button pressing capability. The keyboard 116 is an alphanumeric keyboard and/or telephone-type keypad. A composed item may be transmitted over the network 150 through the communications subsystem 104.

For voice communications, the overall operation of the wireless communications device 100 is substantially similar, except that most of the received signals are output to the speaker 118, and most of the signals for transmission are transduced by microphone 120. Alternative voice or audio I/O subsystems, such as a voice message recording subsystem, may also be implemented on the wireless communications device 100. Although voice or audio signal output is accomplished primarily through the speaker 118. The display 110 may also be used to provide additional information such as the identity of a calling party, duration of a voice call, or other voice call related information.

Figure 2:
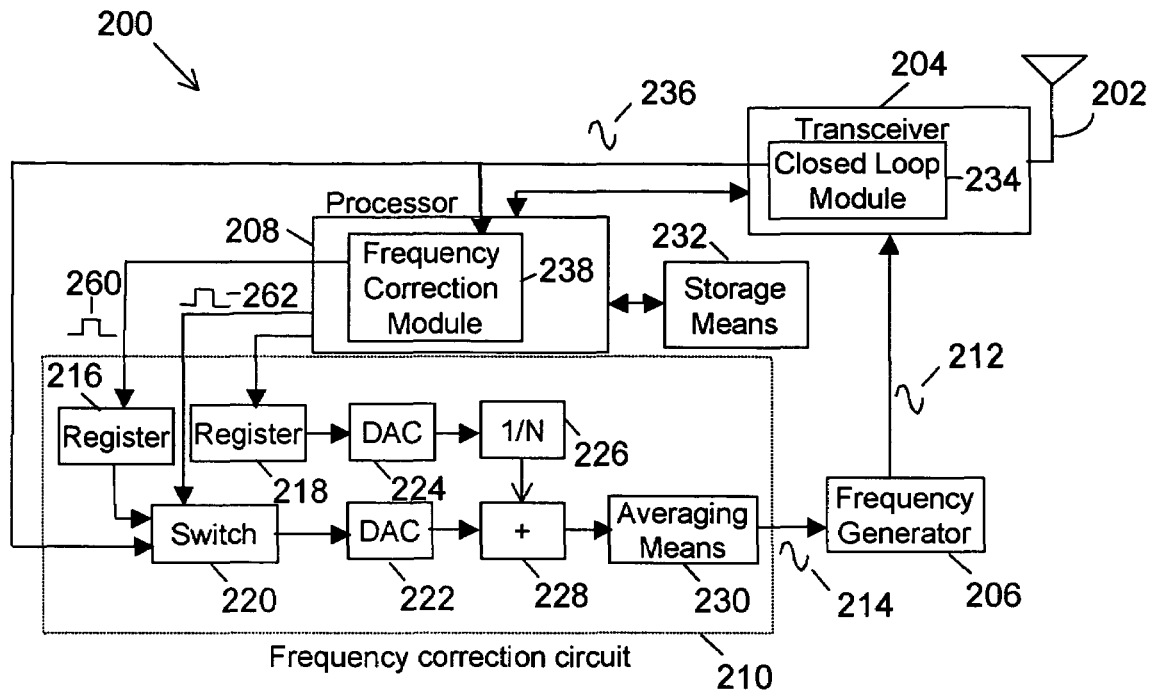
FIG. 2 is a block diagram of an exemplary embodiment of a communications subsystem for use by a wireless communications device.

Referring now to FIG. 2, shown therein is a block diagram of an exemplary embodiment of a communications subsystem 200 that may be used as the communications subsystem 104 for the wireless communications device 100. The particular design of the communications subsystem 200 is dependent upon the network 150 with which the wireless communications device 100 is intended to operate; thus it should be understood that the design illustrated in FIG. 2 serves only as one exemplary embodiment of the communications subsystem 200.

The communications subsystem 200 includes an antenna 202, a transceiver 204, a frequency generator 206, a processor 208 and a frequency correction circuit 210 connected as shown. The frequency generator 206 generates a reference frequency signal 212 that is used by the transceiver 204 to transmit and receive wireless signals. Both signal transmission and reception involve the antenna 202. As previously mentioned, the reference frequency signal 212 may not be accurate for various reasons. Accordingly, the processor 208 works with the frequency correction circuit 210 and a closed loop reference frequency correction module 234 to provide a frequency correction signal 214 to the frequency generator 206 to adjust the frequency value of the reference frequency signal 212.

The processor 208 may be any suitable processing means such as a microprocessor or a Digital Signal Processor (DSP). The frequency generator 206 may be any suitable frequency generation means such as a local oscillator with acceptable precision. In one embodiment, the frequency generator 206 may be a temperature compensated voltage controlled crystal oscillator (a TCVCXO).

In this exemplary embodiment, the frequency correction circuit 210 includes a first register 216, a second register 218, a switch 220, a first digital to analog converter (DAC) 222, a second DAC 224, a scaler 226, a summer 228, an averaging means 230 and a storage means 232 connected as shown. Alternatively, a single dual-DAC device or multi-DAC device that provides more than one internal DAC may be used. In one embodiment, the switch 220 may be a multiplexer, the averaging means 230 may be a low pass filter, and the storage means 232 may be a circular buffer. The processor 208 may also provide the structures required for the first and second registers 216 and 218 and the storage means 232. Each of these components is described in more detail below.

In this exemplary embodiment, the transceiver 204 includes a closed loop reference frequency correction module 234 (see FIG. 3) that receives the reference frequency signal 212 and produces a reference frequency adjustment signal 236. In a conventional wireless communications device, the reference frequency adjustment signal 236 is fed back to the frequency generator 206 which then corrects the value of the reference frequency signal 212. However, as previously explained, this frequency correction does not perform optimally especially in the cases that were outlined earlier.

The processor 208 includes a frequency correction module 238 that receives the reference frequency adjustment signal 236 when the communications subsystem 200 is operating in a closed loop correction mode to determine a correction value for use when the communications subsystem 200 is not operating in a closed loop correction mode, which is described in further detail below. The processor 208 also includes other structures and software programs (both not shown) for controlling the operation of the wireless communications device 100. The frequency correction module 238 provides values to the processor 208 for signal 260 and the signal provided to the register 218 when the communications subsystem 200 operates in a mode other than closed loop mode. The processor 208 relays these values to certain components in the frequency correction circuit 210 so that a value for the frequency correction signal 214 is provided that will result in a more accurate frequency value for the reference frequency signal 212 than that provided by the frequency generator 206 without using additional frequency correction in some cases.

Conventionally, the reference frequency adjustment signal 236 is simply routed to an input of the frequency generator 206 so that the frequency generator 206 can adjust the value of the reference frequency signal 212. In one embodiment, the frequency generator 206 may be a TCVCXO module. The TCVCXO initially produces a reference frequency with a certain amount of error. The closed loop reference frequency adjustment module 234 may have a phase and/or frequency comparator that compares the reference frequency signal 212 (or a frequency derived from the reference frequency signal 212) with a desired frequency signal that is derived from the wireless signals received from the wireless network 150. This derivation is done using techniques that are commonly known to those skilled in the art. Typically, a non-zero error is provided at the output of the comparator. This error signal goes through a loop filter to produce the reference frequency adjustment signal 236. During frequency locking, the value of the reference frequency adjustment signal 236 is continually adjusted by the closed loop reference frequency module 234 until the comparator provides an error signal having an acceptably small value. Such feedback is continuously on-going in a conventional communications subsystem. This operation can still be performed in the communications subsystem 200 when the processor 208 configures the closed loop frequency compensation module 234 and the frequency correction circuit 210 to operate in an acquisition or tracking mode (this is also known as closed loop reference frequency correction mode or closed loop mode). There may also be a temperature compensation lookup table that is used to trim the initial value of the reference frequency adjustment signal 236.

Figure 3:
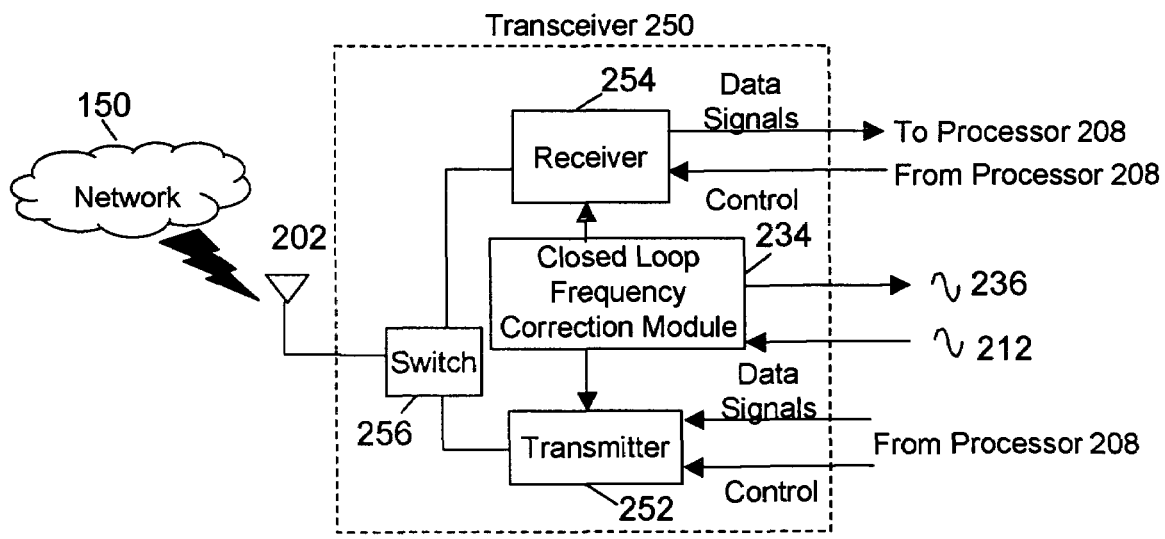
FIG. 3 is a block diagram of an exemplary embodiment of a transceiver used by the communications subsystem of FIG. 2.

Referring now to FIG. 3, shown therein is an exemplary block diagram of a transceiver 250 that can be used with the communications subsystem 200. The transceiver 250 includes the closed loop reference frequency correction module 234 a transmitter 252, a receiver 254 and a switch 256 connected as shown. A duplexer may also be used instead of the switch 256, depending on the air interface technology of wireless network 150 that device 100 works with. Other components may be included as is well known by those skilled in the art. The closed loop reference frequency correction module 234 is connected to the frequency generator 206 to receive the reference frequency signal 212, and also provides an adjustment signal 236 to correct the frequency error when working in closed loop mode. The transmitter 252 and the receiver 254 are connected to the processor 208 to receive control signals and to transmit or receive data. The transmitter 252 and the receiver 254 are also connected to the switch 256 so that the appropriate hardware component is connected to the antenna 202 depending on whether signals are being transmitted or received. If a duplexer is used then it may include a pair of filters so that both transmit and receive signals can be connected to the antenna at the same time since transmission and reception signals can be separated by frequency The antenna 202 may be any antenna that is suitable for wireless transmission as is commonly known to those skilled in the art. The receiver 254 may perform common receiver functions such as signal amplification, frequency down conversion, filtering, channel selection, and analog-to-digital (A/D) conversion. A/D conversion of a received signal allows more complex communication functions such as demodulation and decoding to be performed by the processor 208. In a similar manner, the transmitter 252 may perform such common transmitter functions such as digital-to-analog (D/A) conversion, frequency up conversion, filtering, and amplification. The transmitter 252 and the receiver 254 typically include one or more local oscillators (not shown) that may be phase or frequency locked to the reference frequency signal 212.

The transmitter 252 and the receiver 254 are both connected to the closed loop reference frequency correction module 234 to receive frequency corrected local oscillator (LO) signals derived from the reference frequency signal 212. The transmitter 252 requires the reference frequency signal 212 to derive an LO signal for modulating data signals that are to be transmitted to a higher frequency band. The receiver 254 requires the reference frequency signal 212 to derive an LO signal for demodulating the received wireless signals to a baseband or IF (intermediate frequency) band.

The closed loop reference frequency correction module 234 generates the reference frequency adjustment signal 236 and provides this signal to the processor 208 and the frequency correction circuit 210. Within the closed loop reference frequency correction module 234, there may exist one or a plurality of Phase Locked Loops (PLLs) that are all locked to the reference frequency signal 212, regardless of whether this signal is accurate or inaccurate. When the reference frequency signal 212 is inaccurate, the local oscillators of each PLL are inaccurate, and a frequency or phase comparator within the module 234 will then produce a non-zero frequency adjustment signal 236, when the communications subsystem operates in closed loop mode, to make the reference frequency signal 212 more accurate. In this case, all of the local oscillators become more accurate because they are locked with each other since a correct frequency ratio is typically used by design. However, conventionally, when the closed loop mode is not in use, or at the time at which each PLL is just turned on with a possibly inaccurate initial value for the reference frequency signal 212, each PLL is still locked to one another or very quickly get locked to one another. In this case, the frequency correction circuit 210 provides a correction signal 214 in open loop mode or as an initial value of closed loop mode operation, so that the frequency error of the reference frequency signal 212 is small, which leads to small frequency errors for all of the local oscillators that are locked to the reference frequency signal 212.

The transmitter 252 and receiver 254 may be controlled by the processor 208. For instance, the gains applied to communication signals in the transmitter 252 and the receiver 254 may be adaptively controlled through automatic gain control algorithms implemented in the processor 208. The processor 208 may also perform common communication processing on the signals to be transmitted including modulation and encoding for example. As is commonly known to those skilled in the art, the transmitter 252 receives data signals that are to be transmitted from the processor 208 and the receiver 254 sends demodulated received signals to the processor 208.

The wireless link between the wireless communications device 100 and the wireless network 150 may contain one or more different radio frequency (RF) channels and associated communication protocols are used between the wireless communications device 100 and the wireless network 150. An RF channel is a limited resource that must be conserved, typically due to limits in overall bandwidth and limited battery power of the wireless communications device 100. Accordingly, when the wireless communications device 100 is fully operational, the transmitter 252 in the communications subsystem 200 is typically keyed or turned on only when it is sending data to the network 106 and is otherwise turned off (i.e. put into sleep mode) to conserve resources. Similarly, the receiver 254 in the communications subsystem 200 is periodically turned off (i.e. put into sleep mode) to conserve power until it is needed to receive signals or information, if at all, during the designated time periods.

The closed loop frequency compensation scheme used by module 234 detects the frequency error between the received signal frequency from the wireless network 150 and the generated local oscillator frequency derived from the reference frequency signal 212 and generates the reference frequency adjustment signal 236 in a fashion that is known to those skilled in the art. The signal 236 may be a digitized signal that contains slowly varying values. A description of an exemplary closed loop frequency compensation scheme is provided above.

Depending on the mode of operation, the frequency correction circuit 210 may be retrofitted to an existing communications subsystem to use the reference frequency adjustment signal 236 to improve the accuracy of frequency correction in closed loop mode. In particular, for this exemplary embodiment, when the processor 208 configures the communications subsystem 200 to use the closed loop mode for frequency correction, then the processor 208 adjusts a control signal 262 that controls the switch 220 so that the reference frequency adjustment signal 236 is sent to the first DAC 222, and the value in the first register 216 is ignored. The processor 208 also writes to the second register 218 with a value of "zero" (i.e. the middle value of the entire numerical range for the register 218 and the DAC 224). The second register 218 then passes the value to the DAC 224. In this case, the quantization error is implicitly and automatically corrected by the continuous closed loop adjustment through the inherent loop dithering and the smoothing feature of the averaging means 230.

The first DAC 222 is an n-bit DAC that has N=$2^n$ quantization levels, and the second DAC 224 is an m-bit DAC that has M=$2^m$ quantization levels. Alternatively, two DACs may be used that have the same number of quantization levels, i.e., the special case that N equals M. Both the first and second DACs 222 and 224 have the same total analog output range for simplicity of description, and with this assumption, the analog output from the second DAC 224 is scaled by a value of 1/N by the scaler 226 since N is the number of quantization levels of the first DAC 222. This scaling ensures that the full range of the DAC 224 will cover the smallest quantization level interval of the DAC 222. Under ideal conditions, this configuration will make it appear as if blocks 222, 224, 226 and 228 are equivalent to a (m+n) bit DAC in principle. However, in practice, the actual resolution may be less than m+n with this technique. The output from the scaler 226 and the first DAC 222 are then combined at the summer 228. This allows the resolution of the input to the averaging means 230 to be improved. The sign of the value stored in the second register 218 will determine whether the quantization correction value should be added or subtracted to the frequency correction value stored in the first register 216 or DAC 222.

The output of the summer 228 is then preferably smoothed by the averaging means 230. In one exemplary embodiment, the output of the summer 228 is averaged by a low pass filter. In this case, the low pass filter may be a first order filter or two cascaded first order RC low pass filters. The time constant is chosen to be slightly faster than the loop correction speed needed. Other averaging means may be used as is commonly known by those skilled in the art. The output of the averaging means 230 is the frequency correction signal 214 that is fed to the frequency generator 206 to correct the error in the reference frequency signal 212.

In the closed loop mode, the operations performed by the register 218, the second DAC 224, the scaler 226 and the summer 228 have no effect to the frequency correction signal 214, and effectively the signal 214 is equivalent to the reference frequency adjustment signal 236.

It should be noted that the first DAC 222 may be selected to have a fewer number of bits (i.e. the value of n may be reduced) to reduce cost. This is acceptable as long as the individual quantization levels are not too coarse for tuning accuracy that can be achieved through inherent loop dithering. This is because the dithering effects allow for a trade off between speed and resolution. Dithering is a technique that is used to deal with quantization noise when the quantization noise may no longer be random. This occurs when a digital input signal remains at the same value for many consecutive samples, or a digital input is a periodic signal causing consistent analog output error or spurious frequency components at the output of the quantizer. In the exemplary embodiment, dithering noise is added implicitly through closed loop correction fluctuations, due to such factors as LO phase noise and input signal noise. This process is referred to herein as inherent loop dithering. Further, if the communications subsystem 200 updates the values of the reference frequency adjustment signal 236 fast enough, the frequency correction signal 214 may have small enough variations to provide good long term average frequency accuracy that meets a predefined frequency accuracy requirement, after being smoothed by the averaging means 230. The short-term frequency jitters may be minimized by the averaging means 230. In practice, when the overall frequency correction loop is working effectively and has settled, the value of the reference frequency adjustment signal 236 will alternate between the two closest quantization levels that are adjacent to the ideal reference frequency value. Accordingly, the "dithered signal" (i.e. the frequency correction signal 214), after being smoothed by the averaging means 230, lies between two quantization levels, and it will be closer to the desired value to achieve a desired reference frequency.

To make a correction to the reference frequency signal 212, the following control polarity may be assumed: a higher voltage value for the frequency correction signal 214 may indicate that the value of the reference frequency signal 212 must be increased. Accordingly, if a positive frequency correction must be made (i.e. the value of the reference frequency signal 212 must be increased), the frequency correction circuit 210 may provide a higher voltage for the frequency correction signal 214 to achieve the correction. Alternatively, a negative frequency correction can be made by selecting a smaller voltage value for the frequency correction signal 214. The polarity of this control scheme may be reversed.

The operation of the communications subsystem 100 will now be discussed for a variety of cases in which the communications subsystem 200 is switched away from closed-loop correction mode, such as when the communications subsystem 200 is switched away from traffic channel operation, or before the communications subsystem 200 gets into continuous closed-loop correction mode. These cases correspond to cases 1 to 4 discussed previously. During settled continuous closed-loop correction mode, the frequency correction module 238 reads the value of the reference frequency adjustment signal 236 periodically (for example, every 0.5 seconds). In a preferred embodiment, the values of the reference frequency adjustment signal 236 are stored in the storage means 232 which may be a circular buffer (i.e. a buffer that overwrites the oldest value with the newest value and keeps a predetermined number of the readings). Prior to the instance in which the transceiver 204 must tune away from the current signal source in the wireless network 150 to another signal source for which closed loop frequency correction mode is not suitable, the frequency correction module 238 calculates the average value of the sampled values for the reference frequency adjustment signal 236 that have been stored in the circular buffer. The nearest available quantized value for the DAC 222 is found. The quantized value is written to the first register 216. The residual quantization error, which is the average value of the sampled values that have been stored in the storage means 232 minus the quantized value that has just been written to the first register 216 after being multiplied by M, is converted to the nearest available quantized value with regards to the second DAC 224 and loaded into the second register 218. Effectively at the same time instant that the value was just written to the register 218, the processor 208 controls the switch 220 to receive the value stored in the first register 216. The transceiver 204 can then be tuned to the new signal source. While the transceiver 204 is tuned to the new signal source, the frequency generator 206 holds its frequency without the aid of the closed loop corrections. Accordingly, the reference frequency generator 206 still stays at the existing frequency, and the local oscillators in the PLLs tune to the new signal source. This may be achieved by changing the frequency dividing ratios in the PLLs. It should be noted that the value stored in the second register 218 and provided to the second DAC 224 corrects the quantization error caused by the first DAC 222. When the transceiver 204 tunes back to the frequency that was previously being tracked prior to switching to the new signal source, the values stored in the first register 216 and second register 218 together are used to maintain a good initial frequency for the reference frequency generator 206. Then, after a "warm-up" period controlled by a timer (not shown) in the processor 208, the processor 208 instructs the transceiver 204 to enable closed loop frequency correction mode, write a "zero" or middle value of the digital range to the register 218, send a control signal 262 to make the switch 220 select the signal 236, and the reference frequency generator 206 is then corrected by closed loop correction if need be.

When there is insufficient dithering in closed-loop correction mode, the samples read by the frequency correction module 238 from the reference frequency adjustment signal 236 for calculating the correction values described above may not be adequate for providing for accurate open loop frequency correction when the communications subsystem 100 switches away from closed-loop correction mode. Such a situation occurs when, for example, the quantization resolution of signal 236 is designed too coarse relative to the inherent dithering strength, so that the inherent dithering cannot adequately fill up the gaps of the quantization. When signal 236 is sampled by the frequency correction module 238, it is possible that many of the sampled values may stay at the same quantization level. Therefore, in an alternative embodiment, artificial dithering can be added in the closed loop correction mode prior to switching to the open loop correction mode. The artificial dithering may be added to any embodiment of the communications subsystem described herein. Artificial dithering may be used to increase the resolution that is necessary for obtaining more accurate information (which is later to be used in open loop correction mode) about the reference frequency adjustment signal 136 during closed loop correction mode. The determination to use artificial dithering may be used based on a priori knowledge or observation of the number of transitions between quantization states of the reference frequency adjustment signal 136 during a fixed time period.

Artificial dithering may be added by the frequency correction module 238, or another portion of the processor 208, and is used to perturb the closed-loop correction portion of the communications subsystem enough to obtain the true setting in the frequency adjustment signal 236 needed for minimum frequency error rather than observing the state it last settled in due to quantization effects.

Artificial dithering may be added by reading the value of the frequency adjustment signal 236, denoted as x, and after adding a dithering value y, writing the dithered value x+y to the register 216. The processor 208 then adapts the control signal 262 so that the switch 220 selects the value from the register 216 for a short period of time and then switches back to and uses the signal 236 for a while. The artificial dithering is applied repeatedly in this fashion while the frequency correction module 238 repeatedly samples the values of the reference frequency adjustment signal 236. The dithering value y may be a small value chosen from an appropriate random number sequence or periodic sequence. One example of a periodic sequence is +δ and −δ where δ is a small value, such as the minimum quantization level represented by the LSB (least significant bit) value of the reference frequency adjustment signal 236. Artificial dithering is not performed during the open loop mode.

The open loop frequency correction of the communication subsystems can achieve an accurate initial value for the reference frequency signal 212 to improve the success rate of signal acquisition when the transceiver 204 wakes up from sleep mode. In order to achieve long battery life, when not being used, the wireless communications device 100 is designed to predominantly operate in sleep mode yet periodically wake up for very short durations to check if there are any incoming signals. If no incoming signals are intended for this device 100, then the wireless communications device 100 promptly returns to sleep mode for a few seconds. However, when the transceiver 204 "wakes up" for receiving an incoming signal, the frequency generator 206 needs to establish an accurate initial value for the reference frequency signal 212 for acquiring any possible incoming signals. After acquiring an incoming signal, the transceiver 204 usually relies on the closed loop frequency compensation scheme. Before the transceiver 204 goes back to sleep mode, the latest value of the frequency correction signal 214 that is required for the frequency generator 206 is retained in order to speed up signal acquisition when the transceiver 204 next wakes up. In this case, the correction values obtained during the previous instance of the closed loop correction mode is usually sufficiently accurate even though there are some unwanted changes due to temperature drift, quantization error (which the various embodiments of the communication subsystem address), etc. The temperature drift is usually small enough, and so relying on a previously settled value is sufficient. However, the quantization error of the first DAC 222 remains an issue when setting up the initial value for the reference frequency signal 212 when the transceiver 204 next wakes up.

During idle mode, in which the transceiver 204 is in between the "wake-up" and "sleep" states, the communications subsystem 200 may operate in a variety of ways. In a first exemplary embodiment, immediately after waking up, the frequency correction module 238 may clear the storage means 232, and after the frequency correction module 238 detects that the reference frequency adjustment signal 236 has settled (due to closed loop frequency compensation), the frequency correction module 238 may read several values from the reference frequency adjustment signal 236 while the transceiver 204 is in the wakeup state. The values are stored in the storage means 232 until the transceiver 204 goes into the sleep state again. Many values are sampled and stored because while the communications subsystem 200 is in the steady state during the tracking mode operation, the reference frequency adjustment signal 236 is dithering since it has to produce an analog value that may be between two quantization levels of the first DAC 222. Prior to the next wakeup, the frequency correction module 238 calculates the values for the first register 216, which stores the value to correct the reference frequency signal 212, and the second register 218, which stores the quantization error correction value, using the same method as used in traffic mode which was described above. The value that is stored in the first register may be the average of the stored sampled values subject to quantization. The processor 208 then configures the switch 220 to receive its input from the first register 216. It has been found that this technique results in good reference frequency initialization.

In an alternative embodiment, during the wakeup state, the frequency correction module 238 may read only one value from the reference frequency adjustment signal 236 at the end of the wake-up period. At this time the closed loop frequency compensation should have settled and the frequency correction module 238 should have determined that the reference frequency adjustment signal 236 has a valid value. This value is written to the storage means 232. Because the storage means 232 is not totally cleared of older stored values, the other values in the storage means 232 are values of the reference frequency adjustment signal 236 at the end of previous wake-up periods. The transceiver 204 then goes into sleep mode. Once the transceiver 204 wakes from the sleep state, the frequency correction module 238 calculates values for the first and second registers 216 and 218 using the same method as was described for traffic mode. The processor 208 then configures the switch 220 to receive its input from the first register 216. In this fashion, at each wake-up, only one reading is sampled and stored in the storage means 232. In this way, the amount of time used to sample data values can be significantly reduced, which increases battery life. However, the method used in the previous embodiment that reads multiple values within the same wake-up period may be more accurate because more recent data is averaged.

Another alternative embodiment is a combination of the two embodiments that were just discussed. Accordingly, during each wake-up, multiple values of the reference frequency adjustment signal 236 are read and written to the storage means 232 after the signal 236 has settled. Some of the values in the storage means 232 are new while others come from previous wake-up states. Accordingly, averaging is preferably used over all of the values stored in the storage means 232, i.e. there is averaging for samples obtained from multiple wake-up states. The rest of the embodiment functions as described previously. This embodiment provides a trade off between battery consumption and accuracy in the reference frequency signal. Alternatively, a weighted average may be used among the values sampled from multiple wake-up periods. In this case, a higher weight is given to more recently sampled data values.

Figure 4:
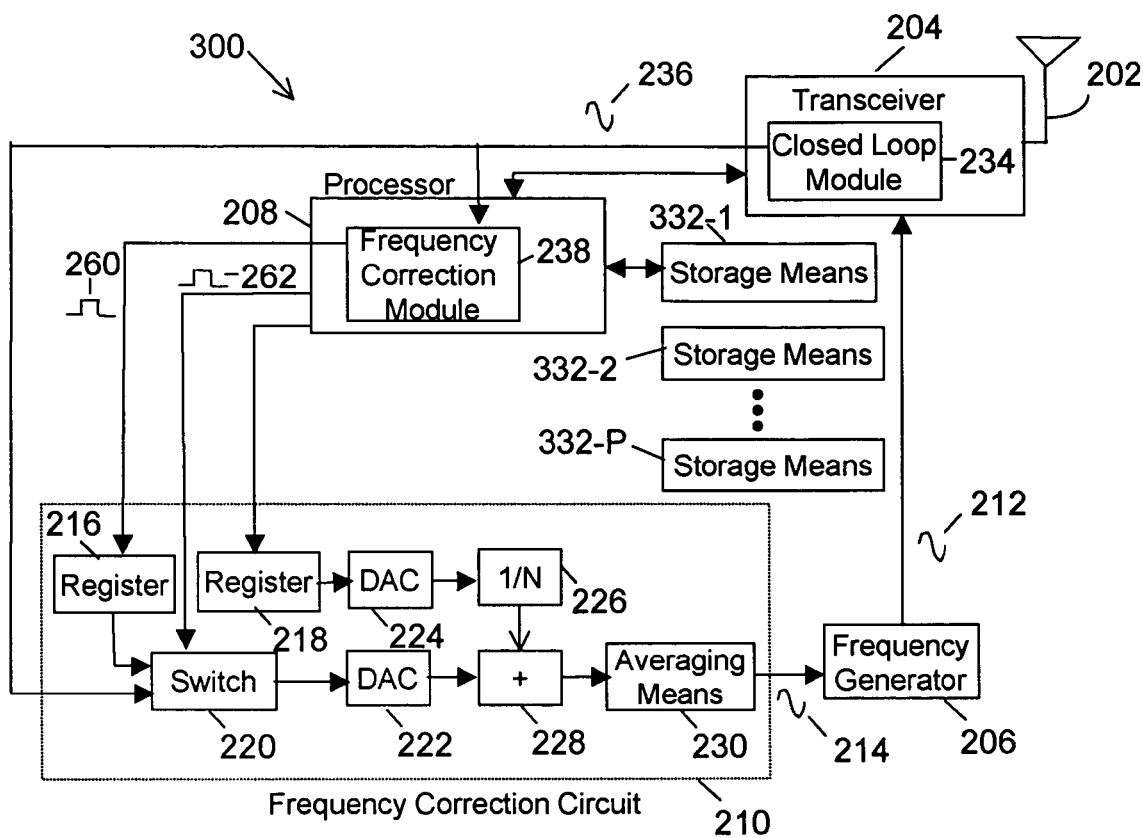
FIG. 4 is a block diagram of an alternative exemplary embodiment of a communications subsystem for use by a wireless communications device.

In some designs, there may be many radio channels over which the transceiver 204 operates and the local oscillators (not shown) in the transceiver 204 may not be tuned exactly to the desired frequency in each of the radio channels. The deviation from the desired frequency may be channel dependant. With such designs, the closed loop frequency compensation scheme will settle at a slightly different value for the reference frequency adjustment signal 236 depending on the radio channel. In this case, an alternative embodiment 300 may be used for the communications subsystem as shown in FIG. 4. The communications subsystem 300 is similar to communications subsystem 200 except that the storage means 232 has been replaced by an array of storage means 332-1, 332-2, . . . , 332-P where P may be the number of different radio channels. The parameter P may be less than the number of radio channels if some of the radio channels behave similarly. If a circular buffer is used for the storage means 232 then each of the storage means 332-1, 332-2, . . . , 332-P may be a circular buffer. Alternatively, the storage means 332-1, 332-2, . . . , 332-P may be a number of address groups in a suitable memory device such as RAM or flash memory. The radio channel that is currently being used by the transceiver 204 provides an index into the array of storage means 332-1, 332-2, . . . , 332-P. The read and write activities will be performed in the same way as described above in the various embodiments except that, the particular radio channel that is being used for signal transmission or reception will be used to index into the array of storage means 332-1, 332-2, . . . , 332-P. When the transceiver 204 is tuned to another signal source for a given radio channel, the average value of the reference frequency adjustment signal 236 should come from the storage means 332-1, 332-2, . . . , 332-P that is indexed by that particular radio channel. Likewise, when updating the values in a particular storage means, the corresponding radio channel is used to index the storage means 332-1, 332-2, . . . , 332-P. The radio channel indexing is performed when the radio performs an inter-channel hard handoff or an inter-channel/band idle handoff.

Figure 5:
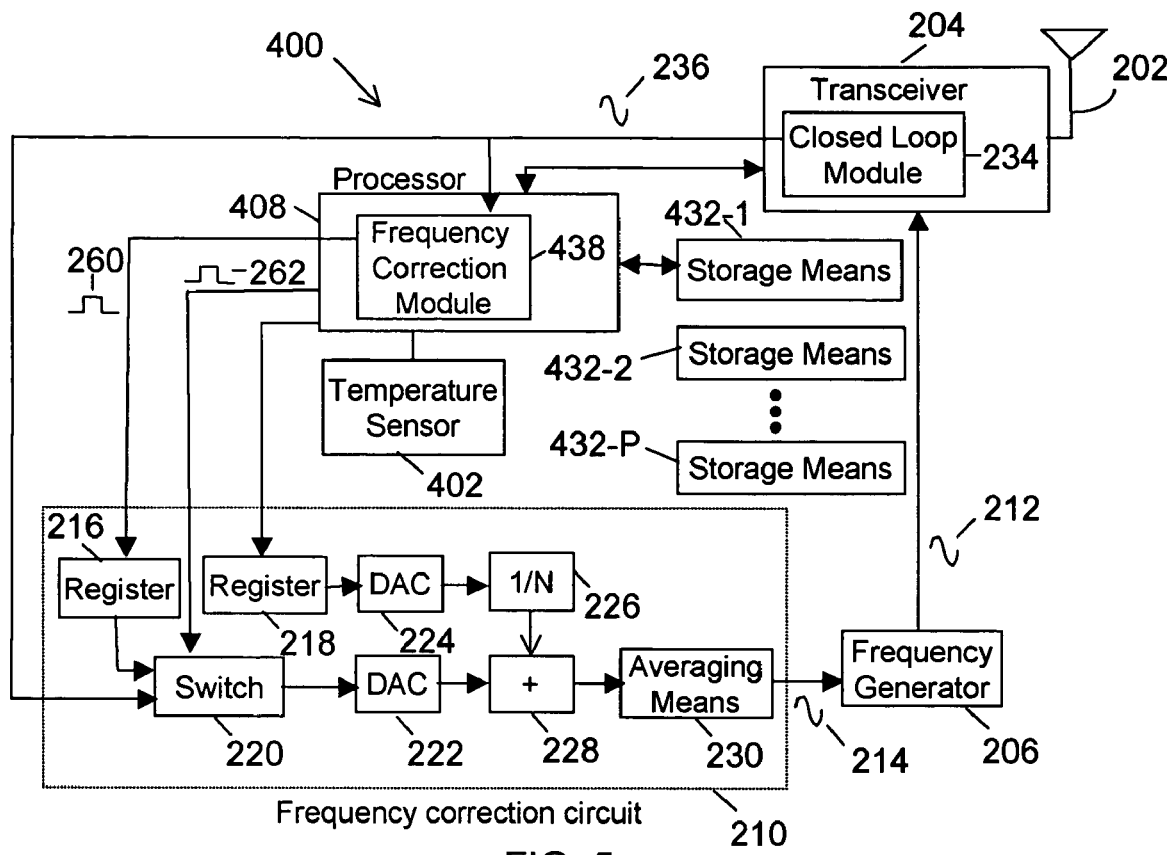
FIG. 5 is a block diagram of another alternative exemplary embodiment of a communications subsystem for use by a wireless communications device; and, FIG. 6 is a block diagram of another alternative exemplary embodiment of a communications subsystem for use by a wireless communications device.

Referring to FIG. 5, shown therein is another embodiment of a communications subsystem 400 which is similar to the communications subsystem 300 except that storage means 432-1, 432-2, . . . 432-P are indexed by operating temperatures rather than radio channel. In this case, the operation temperature of the communications subsystem 400 is also sampled by the processor 408 by reading a temperature sensor 402. When the communications subsystem 400 works in the closed closed-loop correction mode, the frequency correction module 438 periodically reads and stores the value of the reference frequency adjustment signal 236, just as described earlier in other embodiments. When storing the sample values of the frequency adjustment signal 236, the addresses for storing are determined by a temperature range that corresponds to the recently sampled operating temperature. For instance, samples of signal 236 that are obtained while the operating temperature is in the range of 15 to 17.5° C. may be stored in storage means 432-1, samples of signal 236 that are obtained while the operating temperature is in the range of 17.5 to 20° C. may be stored in storage means 432-2, etc. When the communications subsystem 400 needs to tune away to other signal sources and then tune back, or after the communications subsystem 400 has waked up from sleep mode, or after the communications subsystem 400 is turned off for an extended period of time and then turned back on, the processor 408 reads the current operating temperature, and retrieves the stored values in the appropriate storage means corresponding to the operating temperature. The frequency correction module 438 calculates the values for the first register 216, which stores the value to correct the reference frequency signal 212, and the second register 218, which stores the quantization error correction value, using the same method as described above. In this fashion, a good initial value for the frequency correction signal 214 is provided to the frequency generator 206 according to the current operating temperature. Alternatively, instead of storing the raw sample values of the signal 236 to the temperature indexed storage means 432-1, 432-2, . . . 432-P, the mean values of the signal 236 can be calculated and stored. In a further alternative, the calculated values for registers 216 and 218 may be stored in the temperature indexed storage means 432-1, 432-2, . . . 432-P.

In a further alternative embodiment (not shown), a two-dimensional array of storage means may be used which index both radio channels and operating temperature. This embodiment is essentially a combination of communication subsystems 300 and 400.

Figure 6:
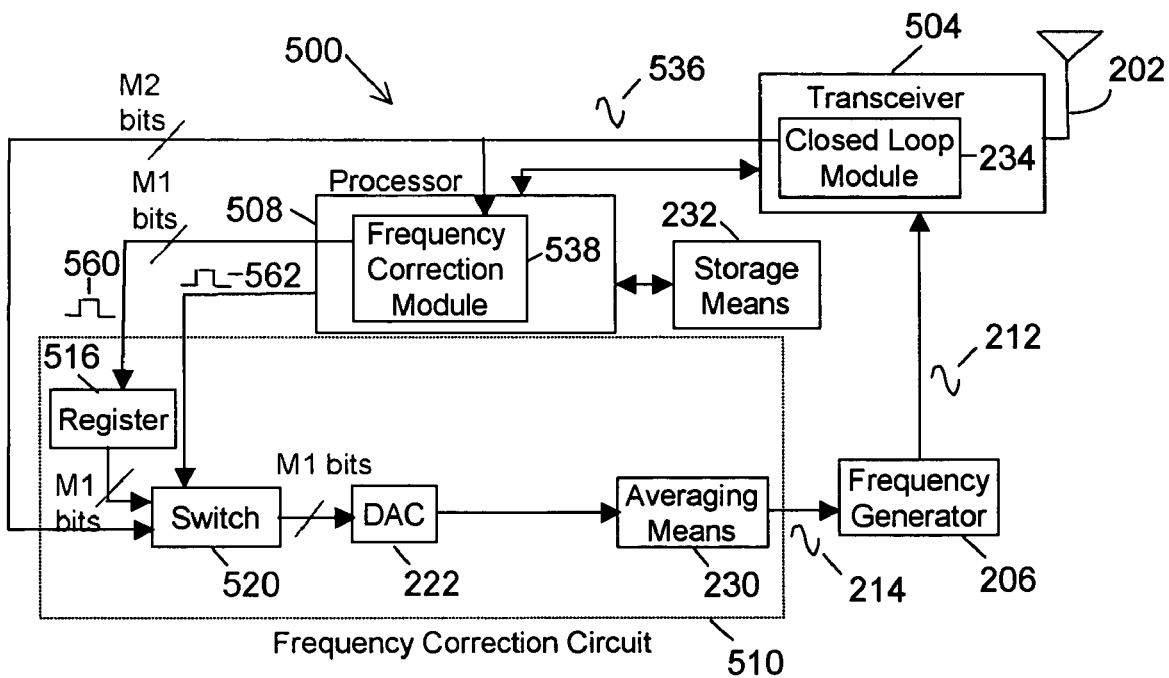

Referring now to FIG. 6, shown therein is an additional exemplary embodiment of a communications subsystem 500 for a wireless device. The communications subsystem 500 is similar to communications subsystem 200 except that the signal path that has the second register 218, the second DAC 224 and the scaler 226 is removed. In addition, the summer 228 is also removed and the signal line from the transceiver 504 has a first resolution or number of bits, and the signal lines from the processor 508 and the register 516 has a second resolution or number of bits.

This embodiment is used when the closed loop correction signal 536 has a different quantization resolution, such as M2 bits as shown in FIG. 6, from that of the control signal 560 which has M1 bits. M1 is larger than M2. The resolution difference or the difference in the number of bits referred to here may be physical, or may also be "effective"; for example, there are additional bits physically present in the hardware that is used but they are not fully used (i.e. some of them are wasted).

The signal 536 is repeatedly sampled in closed loop correction mode prior to switching to open loop correction mode, as was the case in the other embodiments, and the samples are stored in the storage means 232. The sampling may be done periodically throughout the closed loop correction mode or alternatively, only a sufficient number of values may be sampled immediately before switching to the open loop correction mode. When there is a need to change to open loop correction mode, the processor 508 calculates the average of the sampled values stored in the storage means 232. The average value, has a higher resolution than the signal 536 due to the averaging operation. The average value is applied to signal 560 and subsequently to the register 516. When the switch 520 connects to the register 516 to the DAC 222, the full M1 bits are applied to DAC 222. The DAC 222 has a resolution of M1 bits.

However, during closed loop correction mode, the signal 536 that (physically or effectively) has only M2 bits, is applied to the MSBs (most significant bits) of the DAC 222 via the switch 520. The rest of the bits, i.e. the M1-M2 LSBs (least significant bits) are not physically used or physically but not effectively used (e.g. they have effectively a zero value or other constant value). In this case, the switch 520 is more preferably a multiplexer since the number of bits for the inputs are effectively different.

In yet another alternative, which may be applied to each of the embodiments discussed herein, the process of taking the samples of the signal 236 or 536, storing them into the storage means 232, and averaging them, may, in some cases, be replaced by using a low pass filter that accepts the signal 236 or 536 and outputs a smoothed low pass filtered output 260 or 560. The low pass filter preferably has a gain of unity at DC.

During operation, when the wireless device needs to be operated in different modes, such as traffic mode, idle mode, tuning-away mode (i.e. tuning away from the current wireless network), etc, closed loop frequency correction may not always be feasible. It is more beneficial to use an open loop tuning method that provides sufficient frequency accuracy in some modes of operation. The embodiments of the communication subsystems described herein provide a method and apparatus for mitigating the frequency error caused by quantization error without the need for a super high resolution control means and DAC. The more accurate open loop frequency control not only provides higher frequency accuracy when operating in open loop mode, but also helps closed loop frequency correction to settle more quickly when switching back and forth between the two modes since previous correction values for the reference frequency are retained in memory and used to more quickly lock the reference frequency to a desired frequency. This is particularly useful in cases in which the communications subsystem is switched to a different signal source for a short period of time. During that short time duration, one may rely on the reference frequency that was locked to prior to switching to the different signal source, and maintain this reference frequency as much as possible during the short time duration by using the open loop mode of operation.

There are various ways in which the communication subsystems described herein may be implemented. For instance, various portions of the communications subsystems may be implemented with discrete circuit elements, i.e. the registers 216, 218 and the circular buffer 232. Alternatively, these elements may be implemented in a suitable memory element that may be part of the processor 238. Alternatively, some elements of the communication subsystems may be implemented via application specific circuitry such as the frequency correction module 238 or the closed loop reference frequency correction module 234. Alternatively, these elements may also be implemented via software using an appropriate software language such as C, or C++ for example. In other cases, certain components of the communications subsystems may be combined into one element. In another alternative, at the input of the two ADCs 222 and 224, a pair of latches may be connected and controlled by a single control line, so that the two path values are applied more accurately at the same time.

In one aspect, at least one embodiment described herein provides a communications subsystem for a wireless device for correcting errors in a reference frequency signal. The communications subsystem comprises a frequency generator for generating the reference frequency signal; a closed loop reference frequency correction module connected to the frequency generator for generating a reference frequency adjustment signal for correcting the reference frequency signal when the communications subsystem operates in closed loop mode; and, an open loop frequency correction means connected to the closed loop reference frequency correction module and the frequency generator for sampling values of the reference frequency adjustment signal during the closed loop mode and generating a frequency correction signal for correcting the reference frequency signal when the communications subsystem operates in a mode other than closed loop mode.

The open loop frequency correction means includes a frequency correction module connected to the closed loop reference frequency correction module for obtaining the sampled values and for calculating at least one correction value; and, a frequency correction circuit connected to the frequency correction module and the frequency generator for receiving the at least one correction values and the reference frequency adjustment signal and generating the frequency correction signal.

The frequency correction module may be further adapted to add artificial dithering while sampling the reference frequency adjustment signal when operating in the closed loop mode.

In another aspect, at least one embodiment described herein provides a method for correcting errors in a reference frequency signal for a communications subsystem, the method comprising:

(a) generating a reference frequency adjustment signal for correcting the reference frequency signal by using a closed loop reference frequency correction means when the communications subsystem operates in a closed loop mode;

(b) sampling at least two values of the reference frequency adjustment signal during the closed loop mode; and, (c) providing a frequency correction signal based on the reference frequency adjustment signal when the subsystem operates in closed loop mode and otherwise providing the frequency correction signal based on a correction value derived from at least two of the sampled values.

In one instance, (c) may further include adding artificial dithering while sampling the reference frequency adjustment signal when operating in the closed loop mode.

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyrights whatsoever.

It should be understood that various modifications can be made to the embodiments described and illustrated herein, without departing from the various embodiments described herein, the scope of which is defined in the appended claims.

The invention claimed is:

1. A communications subsystem for a wireless device for correcting errors in a reference frequency signal, the communications subsystem comprising:
   a) a frequency generator for generating the reference frequency signal;
   b) a closed loop reference frequency correction module connected to the frequency generator for generating a reference frequency adjustment signal for correcting the reference frequency signal when the communications subsystem operates in closed loop mode; and,
   c) an open loop frequency correction means comprising a frequency correction module connected to the closed loop reference frequency correction module for sampling values of the reference frequency adjustment signal during the closed loop mode and for calculating at least one correction value; and a frequency correction circuit connected to the frequency correction module and the frequency generator for receiving the at least one correction value and the reference frequency adjustment signal and generating the frequency correction signal to correct the reference frequency signal when the communications subsystem operates in a mode other than closed loop mode.

2. The communications subsystem of claim 1, wherein the communications subsystem further includes a processor connected to the closed loop reference frequency adjustment module and the frequency correction circuit for controlling the operation of the communications subsystem.

3. The communications subsystem of claim 2, wherein the frequency correction circuit includes a storage means and the frequency correction module samples and stores at least two values of the reference frequency adjustment signal for calculating an average value of the reference frequency adjustment signal, and wherein the correction value is based on the average value.

4. The communications subsystem of claim 2, wherein the frequency correction module is further adapted to add artificial dithering while sampling the reference frequency adjustment signal when operating in the closed loop mode.

5. The communications subsystem of claim 3, wherein the frequency correction circuit further includes a first signal path for receiving one of the correction value and the reference frequency adjustment signal, the first signal path being adapted to base the frequency correction signal on the reference frequency adjustment signal when the communication subsystem operates in closed loop mode, otherwise the first signal path being adapted to base the frequency correction signal on the correction value.

6. The communications subsystem of claim 5, wherein the frequency correction module further calculates a quantization error correction value and the frequency correction circuit further includes a second signal path for generating a quantization error correction signal for correcting quantization errors for the signals generated in the first signal path when the communications subsystem operates in a mode other than closed loop mode.

7. The communications subsystem of claim 6, wherein the quantization error correction value is obtained by subtracting the correction value from a quantized version of the correction value.

8. The communications subsystem of claim 6, wherein the frequency correction circuit further includes:
   a) a summer connected to the first signal path and the second signal path for summing the signals produced by the first and second signal paths and providing a summation signal; and,
   b) an averaging means connected to the summer for smoothing the summation signal and generating the frequency correction signal.

9. The communications subsystem of claim 8, wherein the first signal path includes:
   a) a first register for receiving the correction value produced by the frequency correction module;
   b) a switch connected to the first register and the closed loop reference frequency correction module for selecting one of the correction value and the reference frequency adjustment signal as an output signal based on a control signal received from the processor; and,
   c) a first digital to analog converter connected to the switch for generating an analog version of the output signal of the switch, the first digital to analog converter having N quantization levels.

10. The communications subsystem of claim 9, wherein the second signal path includes:
   a) a second register connected to the frequency correction module for receiving the quantization error correction signal, the quantization error correction signal being previously scaled by a factor of M;
   b) a second digital to analog converter connected to the second register for generating an analog version of the quantization error correction signal, the second digital to analog converter having M quantization levels; and,
   c) a scaler connected to the second digital to analog converter for scaling the output of the second digital to analog converter by a factor of 1/N where N is the number of quantization levels of the first digital to analog converter.

11. The communications subsystem of claim 3, wherein the communications subsystem is adapted for multiple channel communication and the communications subsystem further includes a plurality of storage means for storing values for a plurality of reference frequency adjustment signal samples that correspond to the multiple channels.

12. The communications subsystem of claim 3, wherein the communication subsystem further includes a plurality of storage means for storing values for the reference frequency adjustment signal according to an operating temperature of the subsystem, wherein each storage means represents a range of operating temperatures.

13. The communications subsystem of claim 3, wherein the reference frequency adjustment signal is an M2 bit signal, the correction value is an M1 bit signal, with M1 being greater than M2, and the frequency correction circuit includes a switching means for receiving both the reference frequency adjustment signal and the correction value and providing an output signal having M1 bits of resolution, wherein the frequency correction signal is based on the reference frequency adjustment signal when the communications subsystem operates in closed loop mode, otherwise the frequency correction signal is based on the correction value and wherein the reference frequency adjustment signal is used in the M2 most significant bits of the M1-bit frequency correction signal when operating in the closed loop mode.

14. The communications subsystem of claim 13, wherein the switching means is connected to the closed loop reference frequency module and the frequency correction circuit further includes:
  a) a register connected to the processor for receiving the correction value and connected to the switching means for providing the correction value thereto;
  b) a digital to analog converter connected to the switching means for receiving and converting the output signal into an analog version; and,
  c) an averaging means connected to the digital to analog converter for receiving and smoothing the analog version of the output signal and generating the frequency correction signal.

15. A method for correcting errors in a reference frequency signal for a communications subsystem, the method comprising:
  a) generating a reference frequency adjustment signal for correcting the reference frequency signal by using a closed loop reference frequency correction means when the communications subsystem operates in a closed loop mode;
  b) sampling at least two values of the reference frequency adjustment signal during the closed loop mode; and,
  c) providing a frequency correction signal based on the reference frequency adjustment signal when the subsystem operates in closed loop mode and otherwise providing the frequency correction signal based on a correction value derived from at least two of the sampled values of the reference frequency adjustment signal, wherein, artificial dithering is added when required while sampling the reference frequency adjustment signal when operating in the closed loop mode.

16. The method of claim 15, wherein (c) includes calculating an average of the samples, the correction value being based on the average of sampled values.

17. The method of claim 16, wherein (c) further includes calculating a quantization error correction value and generating a quantization error correction signal for reducing quantization errors in the frequency correction signal, the quantization error correction signal being obtained by subtracting the correction value from its quantized version, and being scaled by M.

18. The method of claim 17, wherein (c) further includes converting the correction value into a first analog signal using M levels of digital to analog converter, and converting the quantization error correction value into a second analog signal using N levels of digital to analog converter and then scaling the second analog signal by a factor of 1/N prior to combining with the first analog signal, wherein N and M can be same value or different.

19. The method of claim 18, wherein (c) further includes smoothing the combined signal.

20. The method of claim 15, wherein the communications subsystem is adapted for multiple channel communication and (b) further includes storing values for a plurality of reference frequency adjustment signals that correspond to the multiple channels.

21. The method of claim 15, wherein (b) further includes storing values for the reference frequency adjustment signal according to an operating temperature of the subsystem, wherein values are stored according to a range of operating temperatures.

22. The method of claim 16, wherein the method includes providing the reference frequency adjustment signal as an M2 bit signal, the correction value as an M1 bit signal, with M1 being greater than M2, and the method further includes receiving both the reference frequency adjustment signal and the correction value and providing an output signal having M1 bits of resolution, and wherein the reference frequency adjustment signal is used in the M2 most significant bits of the M1-bit frequency correction signal when operating in the closed loop mode.

23. The communications subsystem of claim 3, wherein the frequency correction module is further adapted to add artificial dithering while sampling the reference frequency adjustment signal when operating in the closed loop mode.

* * * * *

UNITED STATES PATENT AND TRADEMARK OFFICE
CERTIFICATE OF CORRECTION

PATENT NO. : 7,508,888 B2
APPLICATION NO. : 11/116233
DATED : March 24, 2009
INVENTOR(S) : Wen-Yen Chan et al.

Page 1 of 1

It is certified that error appears in the above-identified patent and that said Letters Patent is hereby corrected as shown below:

In Claim 2, Column 17, line 42: replace "adjustment" with --correction--

Signed and Sealed this

Twenty-third Day of June, 2009

JOHN DOLL
*Acting Director of the United States Patent and Trademark Office*